(12) United States Patent
Farrar

(10) Patent No.: US 6,624,519 B1
(45) Date of Patent: *Sep. 23, 2003

(54) ALUMINUM BASED ALLOY BRIDGE STRUCTURE AND METHOD OF FORMING SAME

(75) Inventor: Paul A. Farrar, South Burlington, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/477,506

(22) Filed: Jan. 4, 2000

Related U.S. Application Data

(63) Continuation of application No. 08/847,673, filed on Apr. 24, 1997, now Pat. No. 6,075,278.

(51) Int. Cl.$^7$ ............................................. H01L 23/52
(52) U.S. Cl. ..................... 257/771; 438/688; 257/773
(58) Field of Search ...................... 257/522, 771, 257/773; 438/619, 688, 687

(56) References Cited

U.S. PATENT DOCUMENTS

| | | | |
|---|---|---|---|
| 5,032,359 A | 7/1991 | Pickens et al. | 420/533 |
| 5,117,276 A | 5/1992 | Thomas et al. | 357/71 |
| 5,408,742 A | 4/1995 | Zaidel et al. | 29/846 |
| 5,510,645 A | 4/1996 | Fitch et al. | 257/522 |
| 5,552,924 A * | 9/1996 | Tregilgas | 359/224 |
| 5,591,676 A | 1/1997 | Hughes et al. | 437/195 |
| 5,592,018 A | 1/1997 | Leedy | 257/619 |
| 5,593,926 A | 1/1997 | Fujihara | 437/209 |
| 5,658,698 A | 8/1997 | Yagi et al. | 237/209 |
| 5,909,156 A * | 6/1999 | Nishihara et al. | |
| 6,075,278 A * | 6/2000 | Farrar | |

FOREIGN PATENT DOCUMENTS

| | | |
|---|---|---|
| EP | 326018 A2 | 8/1989 |
| JP | 60257166 | * 12/1985 |
| JP | 01-303910 | 12/1989 |
| JP | 02-159064 | 6/1990 |

OTHER PUBLICATIONS

J. Gorrell, et al. "The influence of strengthening mechamisms on stress relaxation in thin aluminum metallization" Thin Film Stresses: and Mechanical Properties VISumposium, W.W. Gerberich, et al Editors, (1997) p. 27–34. (abstract).*

Fielding et al., "Aluminum–Lithium for aerospace," *Advanced Materials & Processes*, pp. 21–23 (Oct. 1996).

"Metallography, Structures and Phase Diagrams," *Metals Handbook*, vol. 8, Eighth Edition, p. 263.

"Properties and Selection: Nonferrous Alloys and Pure Metals," *Metals Handbook*, Ninth Edition, vol. 2, pp. 157, 727, 732, 816, and 819.

Singer, F.L., "Strength of Materials," *Harpers & Brothers*, pp. 229–232 (1951).

* cited by examiner

*Primary Examiner*—Caridad Everhart
(74) *Attorney, Agent, or Firm*—Mueting, Raasch & Gebhardt, P.A.

(57) ABSTRACT

A bridge structure, such as an air bridge, includes a bridge element formed of an alloy including aluminum, copper, and lithium. The alloy may also further include silicon and the amount of lithium of the alloy is generally greater than about 1.0% by weight up to the maximum solubility limit of lithium in aluminum. Methods for forming bridge structures utilizing such an alloy are also described.

15 Claims, 1 Drawing Sheet

ALUMINUM BASED ALLOY BRIDGE STRUCTURE AND METHOD OF FORMING SAME

This is a continuation of application Ser. No. 08/847,673, filed Apr. 24, 1997, now U.S. Pat. No. 6,075,275, which is incorporated herein by reference.

FIELD OF THE INVENTION

The present invention relates to bridge structures, such as air bridges, used in the fabrication of semiconductor devices. More particularly, the present invention relates to bridge structures formed of aluminum based alloys and methods of forming such bridge structures.

BACKGROUND OF THE INVENTION

Dimensions in integrated surfaces are constantly being reduced. For example, the separation between conductive layers in material is being reduced in order to achieve smaller integrated circuits. By reducing the spacing of conductive materials in an integrated circuit, an increase in capacitive crosstalk is observed. Conventional integrated circuits typically utilize interconnect structures wherein a first metal line is separated from a second metal line by an insulative material. If the capacitive effects between the first metal line and the second metal line is high, i.e., a voltage on one effects a voltage on the other, then the capacitive effects may lead to an inoperable integrated circuit. Even when the capacitive coupling is insufficient to cause crosstalk, making the system inoperable, the increased resistance-capacitance (RC) effect will reduce the maximum operating speed of the circuit.

In order to reduce such capacitive coupling, low dielectric constant materials have been utilized between such conductive materials or lines. However, use of low dielectric constant materials have many associated problems. For example, equipment is not always available to properly process new low dielectric materials in various integrated circuits. Further, for example, such dielectric materials may not properly or adequately reduce such capacitive coupling between the conductive materials.

Bridge structures, such as air bridges, have provided integrated circuit designers with a method to reduce such capacitive coupling. The air bridge will become a commonly used low capacitive wiring structure as dimensions become smaller and wiring capacitive/resistive effects between conductive materials in integrated circuits become a larger portion of the delay associated with operation of a semiconductor device. For example, an air bridge provides a simple technique for crossing over a conductor when forming an interconnect between two other conductive material regions of an integrated circuit.

However, an air bridge cannot be made indefinitely long. The maximum length of an air bridge, e.g., the length from one pillar or support structure of the overall air bridge structure to the next support structure, is determined by either how long the air bridge can be before it breaks or is determined by how long the air bridge can be before it sags under the air bridge's own weight such that it contacts another portion of the device structure or circuit being fabricated leading to short circuit or other operational problems. The presently utilized metals or alloys for forming air bridges, such as, for example, gold, aluminum, aluminum/copper alloy, aluminum/copper/silicon alloy, and tungsten, do not provide for air bridges of adequate length in many circumstances.

For the above reasons, there is a need in the art for bridge structures, such as air bridges, formed of new metals or alloys. In addition, there is a need for methods of forming such bridge strictures using such metals or alloys to provide bridge structures of effective lengths. The present invention, as described below, overcomes the problems described above, and other problems which will become apparent to one skilled in the art from the detailed description below.

SUMMARY OF THE INVENTION

The present invention includes a bridge structure. The bridge structure includes a bridge element formed of an alloy comprising aluminum, copper, and lithium.

In other embodiments of the bridge structure, the alloy may further include silicon and the alloy may include an amount of lithium greater than about 1.0 percent by weight up to the maximum solubility limit of lithium in aluminum.

Another bridge structure in accordance with the present invention includes a bridge element formed of an alloy including aluminum, about 1.0 to about 4.2 percent by weight of lithium, about 0.2 to about 5 percent by weight of copper, and 0 to about 1.6 percent by weight of silicon.

A method of forming a bridge structure in accordance with the present invention is also described. The method includes providing a surface and forming a removable region of material over a portion of the surface. A bridge element is formed over the removable region of material. The bridge element is formed of an alloy including aluminum, copper, and lithium. The removable region of material is removed.

The present invention also includes an air bridge. The air bridge includes abridge element formed of an alloy comprising aluminum, copper, and lithium.

In one embodiment of the air bridge, the alloy further includes silicon. In another embodiment, the alloy includes an amount of lithium greater than about 1% by weight up to the maximum solubility limit of lithium in aluminum.

Another air bridge in accordance with the present invention includes a bridge element. The bridge element is formed of an alloy comprising aluminum, about 1 to about 4.2% by weight of lithium, about 0.2 to about 5.0% by weight of copper, and 0 to about 1.6% by weight of silicon.

Another air bridge in accordance with the present invention for use as an interconnect is described. The air bridge includes a bridge element formed of an alloy consisting essentially of aluminum, copper, and lithium. In one embodiment of the air bridge, the alloy includes an amount of lithium greater than about 1.0% by weight up to the maximum solubility limit of lithium in aluminum.

Yet another air bridge in accordance with the present invention for use as an interconnect is described. This air bridge includes a bridge element formed of an alloy consisting essentially of aluminum, copper, lithium, and silicon. In one embodiment of this air bridge, the alloy includes an amount of lithium greater than about 1.0% by weight up to the maximum solubility limit of lithium in aluminum. In another embodiment of this air bridge, the alloy includes silicon in an amount of about 1.0% or more up to the maximum amount of solubility limit of silicon in aluminum.

A method of forming an air bridge in accordance with the present invention is also described. The method includes providing a surface and forming a removable region of material over a portion of the surface. A bridge element is formed over the removable region of material. The bridge element is formed of an alloy comprising aluminum, copper, and lithium. The removable region of material is removed to define an air gap between the surface and the bridge element. In one embodiment of this method, the alloy further includes silicon.

Another method of forming an air bridge interconnect is also described. The method includes providing a substrate assembly having two contact regions. Each of the contact regions have a diffusion barrier associated therewith. A removable region of material is formed over a portion of the substrate assembly between the two contact regions. A bridge element is formed over the removable region of material and in contact with each of the contact regions. The bridge element is formed of an alloy consisting essentially of aluminum, copper, and lithium. The removable region of material is removed to define an air gap between the substrate assembly and the bridge element.

DETAILED DESCRIPTION OF THE EMBODIMENTS

Bridge structures, such as air bridges, formed of aluminum based alloys in accordance with the present invention and generalized methods of forming such structures utilizing such aluminum based alloys shall be described with reference to FIGS. 1–3. In the following detailed description, reference is made to the accompanying figures which form a part hereof, and in which is shown by way of illustration the manner in which the invention may be practiced. These embodiments are described in sufficient detail to enable those skilled in the art to practice the invention. It is to be understood that other embodiments may be utilized and that changes may be made without departing from the scope of the present invention as defined in the accompanying claims.

The present invention describes a bridge structure formed relative to a surface of a wafer or substrate assembly. The terms wafer and substrate assembly include any substrate supported structure, i.e., such as a semiconductor substrate or any other substrate having one or more layers or structures formed thereon. Both terms are to be understood as including silicone-on-sapphire (SOS) technology, silicon-on-insulator (SOI) technology, doped and undoped semiconductors, epitaxial layers of silicon supported by a base semiconductor, as well as any other semiconductor based structures well known to one skilled in the art. Furthermore, when a reference is made to a wafer or a substrate assembly in the following description, previous process steps may have been utilized to form regions/junctions/lines, such as metalized lines, in a semiconductor based structure previously formed. The following detailed description is, therefore, not to be taken in a limiting sense, as the scope of the present invention is defined by the appended claims. It is further to be understood that the present invention is not limited to bridge structures formed relative to silicon wafers, but rather other types of wafers (e.g., gallium arsenide wafers) can be used as well.

It will be readily apparent to one skilled in the art from the description below relative to air bridges, that any bridge structure may be formed using the alloys described herein, i.e., not just an air bridge structure. For example, the bridge element of the bridge structure, which herein is defined as the portion of a bridge structure extending between two or more support elements, need not be formed such that an air gap exists between the bridge element and surface over which the bridge element is formed. After the bridge element is formed, the region under the bridge element may include any type of material, such as a material that does not lend support to the bridge element, i.e., a flexible material. The remainder of the description below is focused to the formation of air bridges. However, any and all such description can be easily applied to any bridge structure.

Figure 3:
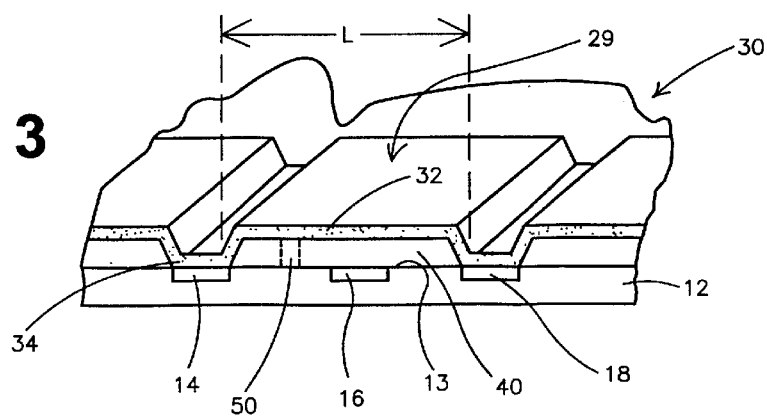

In accordance with the present invention, an air bridge structure for use in the fabrication of devices, such as shown by the air bridge structure 29 of FIG. 3, is described. As shown in FIG. 3, the air bridge structure 29, formed such as in the manner described generally below, includes an arched bridge element 32 and base members 34 in contact with respective metalized regions 14 and 18 formed relative to substrate assembly 12. As indicated above, the term bridge element as used herein refers to any element between two or more support elements, i.e., element 32 between base members 34. For exemplary purposes, conductor 16 is located between metalized regions 14 and 18 and lies beneath the air bridge structure 29. The metalized region 16 is neither in mechanical nor electrical contact with the arched bridge element 32 thus providing a manner for maintaining an air insulated relationship between crossing conductor regions, which both derive support from a common surface 13.

It should be readily apparent to one skilled in the art that, in accordance with the present invention, the form of the air bridge structure may take any shape or configuration, as long as it includes a bridge element in spaced relationship with a substrate assembly surface, thus forming a gap therebetween. For example, the arched bridge element may take the form of a smooth curve, a curve with various discontinuities or directional transitions, or any other shape or form. The air bridge structure, in accordance with the present invention, is not limited to any particular application, i.e., such as a crossing conductors application as shown in FIG. 3. Further, it should be readily apparent that the arched bridge element 32 may be of any length. If a length is desired which is longer than the maximum length allowable without breaking or sagging to an unallowable state using the alloys as described herein, then pillars or additional support structure, as generally represented by the dashed line optional support element 50 (FIG. 3), may be fabricated for support of the bridge element 32 as is generally known to one skilled in the art. Therefore, it is apparent that the aluminum based alloys as described further below are applicable to any air bridge structure having a bridge element spaced from a surface so as to form a gap therebetween.

As described in the Background of the Invention section, the air bridge structure 29 cannot be made indefinitely long. The length (L) of the bridge element, defined as the length of an element between support structures or pillars of an air bridge structure (as shown in FIG. 3), is determined by two factors. It is determined by how long the air bridge element can be before the air bridge breaks. Further, it is determined by how long the air bridge element can be before it sags under its oven weight such that it contacts another portion of the structure or circuit with which it is being formed causing operational problems, such as a short circuit situation.

A classical mechanics approach provides guidance in selection of alloying materials to utilize in the formation of air bridge structures. For a beam, such as a bridge element, with a uniform loading, deflection ($\delta$) of the beam is as shown in Equation 1 when the beam ends are not constrained.

$$\delta = \frac{5w(L)^4}{384EI} \quad \text{Equation 1)}$$

If the beam ends are constrained, then deflection (δ) is as shown in Equation 2.

$$\delta = \frac{w(L)^4}{384EI} \quad \text{Equation 2)}$$

where: E is the modulus of elasticity of the material of which the beam is made;

I is the moment of inertia of the beam which is equal to $$\frac{b(h)^3}{12};$$

w is the weight per unit length which is equal to (ρbh);

b is the width of beam;

h is the height of the beam; and

ρ is the density of material of which the beam is made. Therefore, for a constrained beam, $(L)^4=(32E\delta(h)^2)/\rho$, and for an unconstrained structure, $(L)^4=(32E\delta(h)^2)/5\rho$.

If a limiting factor for determining bridge element length is when the element (i.e., beam) breaks, then the maximum stress is equal to the yield stress of the beam [S(max)=M/Z] where M=the moment of force (bending moment) and Z=the section modulus of elasticity, which for a rectangular beam is equal to $b(h)^2/6$. The moment (M) would=WL/2 where W is equal to the weight of the beam or ρbhL. Therefore, moment (M) is equal to $\rho bh(L)^2/2$ and $(L)^2=hS/3\rho$, where S as shown above is the maximum allowable stress which in a normal structure is typically the yield strength divided by an appropriate safety factor. Therefore, density (ρ) plays a determining role in the maximum length possible before breakage and the density of the alloys chosen for forming the air bridge should have low density to maximize length (L).

However, typically, in many applications, the maximum length will be determined by the maximum allowable sag which can be permitted in the bridge element as opposed to the breakage point. For example, such an application includes the case where semiconductor device interconnect levels have metal thickness of about one micron or less and the distance between the metal levels, such as in crossing conductor applications, is about one micron or less.

In such circumstances, such as when the distance between metal levels determines the maximum allowable sag, the maximum length which the bridge element can span is a function of the ratio of the modulus of elasticity (E) of the material of which the bridge is made to the density (ρ) of the material of which the bridge element is made, e.g., E/ρ ratio. In particular, this ratio E/ρ should be as high as possible to maximize length (L), where L=

$\sqrt[4]{32E\delta h^{2/5\rho}}$ or $1.6\sqrt[4]{E\delta/\rho}(\sqrt{h})$

As indicated by the above description, aluminum based alloys used for air bridge applications should have a low density as shown by the length maximization/breakage analysis above and also by the desire to have a high E/ρ ratio in the case where sag is the limiting factor. Further, in order to achieve a high E/ρ ratio, a high modulus of elasticity (E) for the alloy is desired. In addition, to perform as an effective conductor, the alloy should exhibit low resistance.

Therefore, in summary, the requirements for maximizing the length (L) of a bridge element through selection of an alloy, are threefold: low density (ρ), high modulus of Elasticity (E), and low resistance.

To meet such requirements, the aluminum based alloy for forming the air bridge structure in accordance with the present invention, includes aluminum, copper, and lithium. The alloy may also include silicon depending on the application as further described below. Other alloying elements may be utilized with the aluminum/copper/lithium alloy if the properties attained by the alloy described are not substantially forfeited. It is desirable to have an alloy which has a high E/ρ ratio relative to other aluminum based alloys without giving up the valuable conductive properties of aluminum.

It should be readily apparent to one skilled in the art that use of the aluminum as the base metal for alloying purposes is generally approximately 99% pure. However, aluminum does contain some impurities, such as iron and silicon. Such impurities are not taken into account when determining the percent by weight content of an alloying element in the description or claims that follow. Such impurities are not taken into account for purposes of determining when silicon is present or is not present in the alloy, nor are they not taken into account for any other purposes. For example, as described herein, when silicon content is set forth as being 0% by weight, the aluminum based alloys described herein may in fact include a small percent by weight of silicon due to the impurities of the aluminum base metal, and the description provided herein along with the claims should be read accordingly.

To form an air bridge satisfying the requirements of having a high modulus, low density, and a low resistance, the aluminum based alloy in accordance with the present invention includes an amount of lithium greater than about 1.0% percent by weight up to the maximum solubility limit of lithium in aluminum (e.g., about 4.2% by weight of lithium depending upon temperature). The lithium being added to the alloy provides for increased stiffness and lower density due to the density of lithium being about 0.53 grams/cm³. This provides an increased stiffness to density ratio or E/ρ ratio relative to an aluminum or aluminum/copper alloy, which increases the allowable length of the air bridge structure. The larger the content of lithium, the higher the E/ρ ratio and thus, the longer the air bridge element. Therefore, preferably, the lithium content is closer to the maximum solubility limit, such as between about 3.0 and about 4.0% by weight. More preferably, lithium content is between about 3.5% to about 4.0% by weight.

The aluminum based alloy for use in air bridge applications, preferably includes about 0.2 to about 5.0% by weight of copper. Copper is required in the alloy to improve the electromigration resistance. Using an amount of copper over about 5.0% by weight is possible. However, such high copper content does not provide significant improvement in electromigration resistance of the air bridge. It is preferable to keep the copper content between about 0.2 and about 1.0% by weight dependent upon the method utilized for forming the air bridge. For example, if reactive ion etching (RIE) is utilized in forming the air bridge structure, then it is preferable to have a content of copper that is below about 1.0%, i.e., between about 0.2 and 1.0% by weight of copper. Higher contents of copper used with RIE leads to the undesirable foreign material formation during the etch process. If other etching techniques, such as solution etches are utilized for etching metalized portions during the formation of the air bridge structure, a higher copper content may be more suitable.

Depending upon the device application in which the air bridge is applied, the aluminum based alloy may also include an amount of silicon in the range of from about 1.0% up to the maximum solubility limit for silicon in aluminum (e.g., typically about 1.65% by weight depending upon temperature). When the air bridge structure is utilized for interconnect between two contact regions and the regions do not have a diffusion barrier associated therewith, then the aluminum based alloy includes such a silicon content.

If a diffusion barrier is utilized, then silicon content in the alloy is unnecessary, although it may still be present. For example, a diffusion barrier utilized in such contact regions may include such typical metals or materials such as tungsten, titanium, and titanium nitride.

When silicon content in the alloy is desired, i.e., when a diffusion barrier is not used, then the use of a large amount of silicon in the alloy close to the solubility limit prevents the diffusion of silicon into the aluminum base alloy from the substrate assembly over which the aluminum based alloy is formed, i.e., where the aluminum based alloy contacts a silicon based surface. It is preferred that silicon not be utilized, unless necessary as a diffusion barrier, as silicon causes an increase in resistance of the air bridge.

The silicon diffusion barrier function may be performed by depositing the silicon in conjunction with the aluminum based alloy, i.e, with the aluminum, copper and lithium alloy deposited, or it may be performed by forming a layer of silicon on the aluminum/copper/lithium based alloy. In the latter case, during a heat treatment, the layer of silicon deposited over the alloy diffuses into the aluminum based alloy before a significant amount of silicon can diffuse from the substrate assembly into the aluminum based alloy. This provides the diffusion barrier function, preventing silicon diffusion from the substrate assembly into the aluminum based alloy during further process steps.

Although other alloying elements may be utilized in conjunction with the aluminum based alloy described above, preferably, the aluminum based alloy consists essentially of aluminum, lithium, and copper as in the case where a diffusion barrier is not necessary, i.e., there is no contact to a silicon based structure. In the case where a diffusion barrier is necessary to prevent silicon diffusion into the aluminum based alloy, the aluminum based alloy preferably consists essentially of aluminum, lithium, copper, and silicon. With respect to the amounts of lithium, copper, and silicon contained in the aluminum based alloy consisting essentially of such elements, the above limits and ranges are applicable. It is apparent to one skilled in the art that with respect to such aluminum based alloys which essentially consist of lithium, copper and aluminum, or lithium, copper, silicon, and aluminum, that amounts of other alloying elements may be present because of their existence as impurities.

Figure 1:
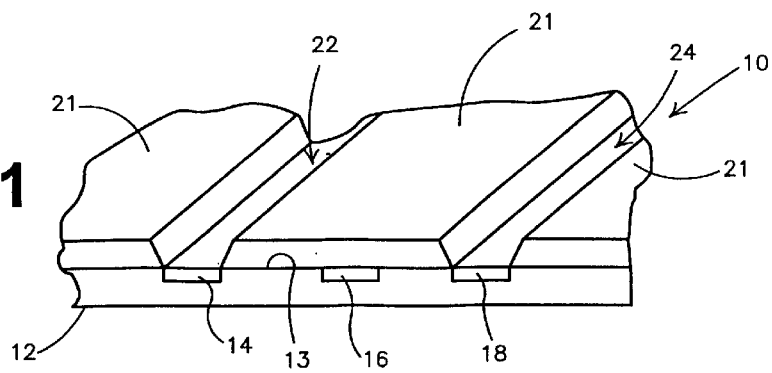
FIGS. 1–3 generally show the steps of formation of a bridge structure, such as an air bridge, utilizing aluminum based alloys in accordance with the present invention.
Figure 2:
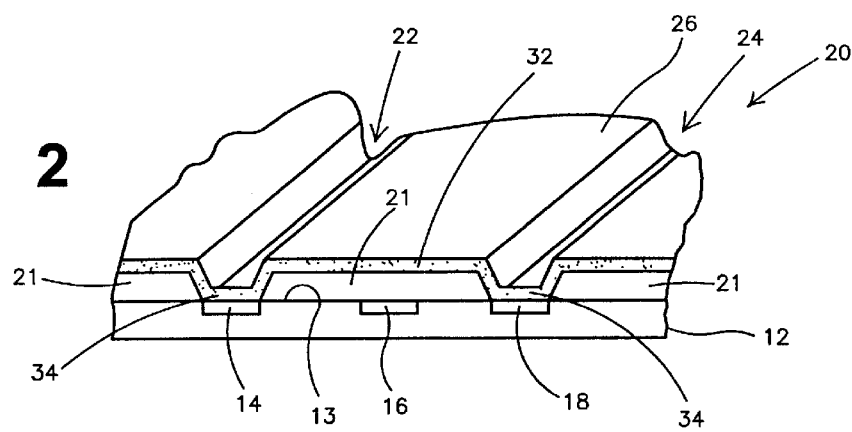

The process steps for use in the formation of an air bridge are generally shown in FIGS. 1–3. Generally, air bridges are formed in the following manner. First, a removable region of material 21 is patterned over a surface 13 as shown in the device structure 10 of FIG. 1. A metalization layer 26 is then formed over the patterned removable region of material 21 as shown by structure 20 in FIG. 2. In accordance with the present invention, the metalization layer 26 is an aluminum based alloy including copper and lithium as described above and in many cases also including silicon as described above. The metalization layer 26 is then patterned and etched as desired and the removable region of material 21 is removed such that an air gap 40 is formed between surface 13 and the air bridge structure 29, as shown by structure 30 in FIG. 3.

The present invention contemplates the use of any method of forming an air bridge structure wherein an air gap is formed between the air bridge structure and a surface and the method uses an aluminum based alloy as described above. Therefore, the process of forming an air bridge as described above and further described below is for illustrative purposes only to generally set forth the steps of creating an air gap between the surface and a bridge element formed thereover. Various processes for forming air bridges and applications for such air bridges are known to those skilled in the art and are clearly contemplated in accordance with the present invention. However, in order to enable one to construct air bridges which may be up to about 8% longer than an air bridge made from an aluminum/0.5% copper alloy or an aluminum/0.5% copper/1.0% silicon alloy, the aluminum based alloys described above including lithium are utilized. Therefore, the illustrative formation processes and steps thereof as described below with reference to FIGS. 1–3 are only for illustration purposes and in no manner are they to be taken as limiting to the present invention which utilizes the aluminum based alloys including lithium as described above.

As shown in FIG. 3, the air bridge structure 29 formed in accordance with the below described process includes an arched bridge element 32 and base members 34 in contact with respective metalized regions 14 and 18. As described above, for exemplary purposes, conductor 16 is located between metalized regions 14 and 18 and beneath air bridge structure 29; the metalized region 16 is neither in mechanical nor electrical contact with the arched bridge element 32 providing an illustration of a crossing conductor application for air bridges.

As shown in FIG. 1, the first step in forming air bridge 29 includes forming a layer of polymer, such as photoresist, upon surface 13 wherein conductive regions 14, 16, and 18 have previously been formed relative to substrate assembly 12. The layer is then patterned utilizing typical photolithography techniques resulting in patterned removable regions of material 21. The patterned layer defines contact openings 22 and 24 which are to be contacted by base members 34 of air bridge structure 29. Openings 22 and 24 are generally defined by tapered sidewalls of the removable regions of material 21. Any material removable by an isotropic etch as described further below may be suitable for formation of the air bridge structure 29. For example, such materials may include a photoresist, a polymer such as Parylene C, or any other removable material.

As shown in FIG. 2, the aluminum based alloy material 26 is deposited over the patterned regions 21. The aluminum based alloy material 26 including aluminum, copper, and lithium, and in many cases silicon, may be formed to a desired thickness by various method. Such formation of material 26 may include, for example, the simultaneous evaporation of the metals from respective sources, i.e., coevaporation; may be sputter deposited from a single deposition target of the aluminum based alloy, may be deposited by the simultaneous sputtering from two or more targets including aluminum, copper, lithium, and in many cases silicon, i.e., cosputtering; or may be deposited by chemical vapor deposition, for example, atmospheric, low pressure, or plasm enhanced chemical vapor deposition. Further, as previously described above, silicon may be deposited after the formation of an alloy layer including aluminum, lithium, and copper to provide a diffusion barrier function if a diffusion barrier is not associated with the conductive regions 14 and 18 and the aluminum based alloy is to be in contact with a silicon based material, i.e., polysilicon, silicon substrate material, n-doped silicon, p-doped silicon, etc.

As shown in FIG. 3, the formed aluminum based alloy metalization layer 26 is patterned using conventional photolithography as desired. For example, patterning of the layer 26 includes an etch of the metalization layer 26. Such an etch may be performed by RIE which provides a highly anisotropic etch. The plasma utilized for the RIE may include any chlorine based plasmas such as $BCl_3$, $CCl_4$, or $Cl_2$. Such RIE is typically utilized when the copper content is below 1% by weight of the aluminum based alloy. If the aluminum based alloy includes a copper content greater than about 1% by weight., then the etch may require the use of a high temperature (above 200° C.) $Cl_2$ etch.

It should be noted that the thickness of the removable region 21 formed on surface 13 of substrate assembly 12 for typical semiconductor interconnect air bridge applications is in the range of about 0.5 microns to about 8 microns. Further, the thickness of the deposited aluminum based alloy metalization layer 26 is of the thickness in the range of about 0.5 microns to about 8 microns. However, as each application for the air bridge will have different length requirements, resistivity requirements and other parameters associated therewith, the thicknesses of the layers formed on substrate assembly 12 to form air bridge structure 29 will significantly vary depending upon the application.

As shown in FIG. 3, after the metalization layer 26 has been etched and the photoresist utilized in patterning the metalization layer 26 is removed, the removable region of material 21 is removed by an isotropic removal process. Removing the region of material 21 creates the air gap 40 between the surface 13 and arched bridge element 32 of the air bridge structure 29. The process of removing the removable region of material 21 depends upon the material utilized in forming such regions. For example, if the removable region of material 21 is photoresist, it is dissolved with a suitable developer.

The resulting air bridge structure 29 includes the bridge element 32 and the base members 34. It should be readily apparent that the process as described with reference to FIGS. 1–3 may be modified such that the base member 34 is of a different material formed separate from the bridge element 32. In addition, it should be readily apparent that other process steps may be to provide for support structures or pillars if necessary to allow for the use of a bridge element that exceeds the allowable length under the circumstance presented, i.e., the support element 50.

Although the invention has been described with particular reference to various embodiments thereof, variations and modifications of the present invention can been made within the contemplated scope of the following claims as is readily known to one skilled in the art.

What is claimed is:

1. An air bridge, the air bridge comprising a bridge element formed of an alloy comprising aluminum, copper, and lithium, wherein the alloy comprises an amount of lithium greater than about 1.0 percent by weight up to the maximum solubility limit of lithium in aluminum.

2. The air bridge according to claim 1, wherein the alloy further comprises silicon.

3. An air bridge for use as an interconnect, the air bridge comprising a bridge element, the bridge element formed of an alloy consisting essentially of aluminum, copper, lithium, and silicon, wherein the alloy comprises an amount of lithium greater than about 1.0 percent by weight up to the maximum solubility limit of lithium in aluminum.

4. The air bridge according to claim 3, wherein the alloy comprises silicon in an amount of about 1.0 percent or more up to the maximum solubility limit of silicon in aluminum.

5. The air bridge according to claim 4, wherein the alloy comprises aluminum, about 1.0 to about 4.2 percent by weight of lithium, about 0.2 to about 5.0 percent by weight of copper, and 0 to about 1.6 percent by weight of silicon.

6. The air bridge according to claim 5, wherein the alloy comprises about 0.2 to about 1.0 percent by weight of copper.

7. A method of forming an air bridge, the method comprising:

providing a surface;

forming a removable region of material over a portion of the surface;

forming a bridge element over the removable region of material, the bridge element formed of an alloy comprising aluminum, copper, and lithium; and removing the removable region of material to define an air gap between the surface and the bridge element.

8. The method according to claim 7, wherein the alloy further comprises silicon.

9. The method according to claim 8, wherein the alloy comprises silicon in an amount of about 1.0 percent or more up to the maximum solubility limit of silicon in aluminum.

10. The method according to claim 7, wherein the alloy comprises an amount of lithium greater than about 1.0 percent by weight up to the maximum solubility limit of lithium in aluminum.

11. The method according to claim 7, wherein the surface comprises at least two conductive areas, the removable region of material formed therebetween.

12. The method according to claim 7, wherein the surface comprises at least one conductive area, the removable region of material formed over the conductive area.

13. A bridge structure, the bridge structure comprising a bridge element formed of an alloy comprising aluminum, copper, and lithium, wherein the alloy comprises an amount of lithium greater than about 1.0 percent by weight up to the maximum solubility limit of lithium in aluminum.

14. The bridge structure according to claim 13, wherein the alloy further comprises silicon.

15. A method of forming a bridge structure, the method comprising:

providing a surface;

forming a removable region of material over a portion of the surface;

forming a bridge element over the removable region of material, the bridge element formed of an alloy comprising aluminum, copper, and lithium, wherein the alloy comprises an amount of lithium greater than about 1.0 percent by weight up to the maximum solubility limit of lithium in aluminum; and removing the removable region of material.

* * * * *